United States Patent
Li et al.

(10) Patent No.: US 9,105,310 B2
(45) Date of Patent: *Aug. 11, 2015

(54) SYSTEM AND METHOD OF PROGRAMMING A MEMORY CELL

(71) Applicant: QUALCOMM Incorporated, San Diego, CA (US)

(72) Inventors: Xia Li, San Diego, CA (US); Seung H. Kang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 13/759,310

(22) Filed: Feb. 5, 2013

(65) Prior Publication Data

US 2014/0219015 A1    Aug. 7, 2014

(51) Int. Cl.
| | |
|---|---|
| *G11C 11/34* | (2006.01) |
| *G11C 11/40* | (2006.01) |
| *G11C 17/12* | (2006.01) |
| *G11C 5/02* | (2006.01) |
| *G11C 7/00* | (2006.01) |
| *G11C 17/16* | (2006.01) |
| *H01L 27/105* | (2006.01) |
| *H01L 27/108* | (2006.01) |
| *H01L 29/78* | (2006.01) |
| *G11C 7/12* | (2006.01) |
| *G11C 11/404* | (2006.01) |

(52) U.S. Cl.
CPC *G11C 7/00* (2013.01); *G11C 11/40* (2013.01); *G11C 17/16* (2013.01); *G11C 7/12* (2013.01); *G11C 11/404* (2013.01); *G11C 2211/4016* (2013.01); *H01L 27/105* (2013.01); *H01L 27/10802* (2013.01); *H01L 29/7841* (2013.01)

(58) Field of Classification Search
CPC ............... G11C 2211/4016; G11C 11/404; G11C 11/40; G11C 17/12; H01L 27/10802; H01L 29/7841; H01L 27/105
USPC .................................................. 365/104, 182
See application file for complete search history.

(56) References Cited

U.S. PATENT DOCUMENTS

| | | | |
|---|---|---|---|
| 7,508,694 B2 | 3/2009 | Terzioglu et al. | |
| 7,808,054 B2 | 10/2010 | Wada | |
| 2004/0047218 A1 | 3/2004 | Peng | |
| 2006/0054952 A1 | 3/2006 | Schoellkopf et al. | |
| 2008/0074915 A1* | 3/2008 | Terzioglu et al. | 365/96 |
| 2008/0283905 A1* | 11/2008 | Won | 257/326 |

(Continued)

OTHER PUBLICATIONS

Kulkarni, et al., "A 32nm High-k and Metal-Gate Anti-Fuse Array Featuring a 1.01 μm2 1T1C Bit Cell", Symposium on VLSI Technology Digest of Technical Papers, 2012, pp. 79-80.

(Continued)

*Primary Examiner* — Ly D Pham
(74) *Attorney, Agent, or Firm* — Toler Law Group, PC

(57) ABSTRACT

A method includes creating a breakdown condition at a semiconductor transistor structure that includes an overlap region and a channel region. The breakdown condition is created by causing a first voltage difference between a gate of the semiconductor transistor structure and the overlap region to exceed a breakdown voltage of the semiconductor transistor structure while maintaining a second voltage difference between the gate and the channel region at less than the breakdown voltage.

40 Claims, 9 Drawing Sheets

(56) References Cited

U.S. PATENT DOCUMENTS

| | | | |
|---|---|---|---|
| 2009/0323387 A1* | 12/2009 | Lin et al. | 365/94 |
| 2011/0103127 A1* | 5/2011 | Kurjanowicz | 365/96 |
| 2011/0108926 A1* | 5/2011 | Bahl | 257/379 |
| 2011/0221000 A1* | 9/2011 | Shima | 257/344 |
| 2012/0008364 A1 | 1/2012 | Lai et al. | |
| 2012/0099361 A1* | 4/2012 | Lin et al. | 365/102 |
| 2012/0134205 A1 | 5/2012 | Lu et al. | |
| 2012/0211841 A1 | 8/2012 | Kurjanowicz | |
| 2012/0228724 A1* | 9/2012 | Mitchell et al. | 257/410 |
| 2013/0143376 A1* | 6/2013 | Pan et al. | 438/294 |

OTHER PUBLICATIONS

Lombardo, et al., "Dielectric breakdown mechanisms in gate oxides", Journal of Applied Physics, Dec. 2005, vol. 98, Issue: 12; pp. 121301 121301 36.

International Search Report and Written Opinion—PCT/US2014/014099—ISA/EPO—Apr. 25, 2014.

* cited by examiner

SYSTEM AND METHOD OF PROGRAMMING A MEMORY CELL

I. FIELD

The present disclosure is generally related to programming a memory cell.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may use a one-time-programmable (OTP) device to program and store a data value. An OTP device may program a data value by creating a gate oxide breakdown at a source, drain, and/or channel region of a transistor within the device, such as a complementary metal oxide semiconductor (CMOS) transistor. A gate oxide breakdown enables current flow between the transistor's gate and the transistor's source/drain region when a read voltage is applied, while a non-programmable device will exhibit substantially zero or very small gate to source/drain current.

Variations in the gate oxide breakdown location with respect to the source, drain, and channel region may affect an amount of resistance caused by the oxide breakdown. For example, an oxide breakdown at the channel region may cause a large bipolar resistance, while an oxide breakdown at either the source region or the drain region may cause a smaller linear resistance.

After the oxide breakdown, a read voltage may be applied to the transistor to detect a read current for a channel breakdown. However, when a read voltage is applied to the OTP device to read the stored data value after the gate oxide breakdown, the source and drain regions of the transistor may be over-stressed if the read voltage corresponds to a read voltage for a breakdown in the channel region (i.e., a large read voltage to compensate for the larger resistance). Over-stressing the source and drain regions of the transistor may cause the transistor to malfunction and may increase leakage current of the transistor. OTP devices may operate in an inversion mode (i.e., an activated channel) and may uni-directionally sense a logic value using a sense amplifier (SA).

III. SUMMARY

Systems and methods to program a memory cell are disclosed. A one-time-programmable (OTP) device includes a programmable transistor. The programmable transistor may be programmed by creating a conductivity path (i.e., a gate-oxide or gate dielectric breakdown) between a gate of the programmable transistor and a source/drain of the programmable transistor. For example, a voltage difference between the gate and the source/drain may exceed a breakdown voltage, thus creating the conductivity path between the gate and the source/drain. To create the conductivity path, a gate voltage may be applied to the gate and a source/drain voltage may be applied to the source/drain. A breakdown is prevented from occurring at a channel region of the programmable transistor by applying a voltage to a well of the transistor that is approximately equal to the gate voltage. Because of an OTP breakdown (i.e., conductivity path) in a source or drain overlap region, the OTP device can work in bi-direction sense amplifier (SA) mode due to a linear low breakdown resistance and may not need to turn on a channel.

In a particular embodiment, a method includes creating a breakdown condition at a semiconductor transistor structure that includes an overlap region and a channel region. The breakdown condition is created by causing a first voltage difference between a gate of the semiconductor transistor structure and the overlap region to exceed a breakdown voltage of the semiconductor transistor structure while maintaining a second voltage difference between the gate and the channel region at less than the breakdown voltage.

In another particular embodiment, an apparatus includes a p-type one-time-programmable (OTP) device. The p-type OTP device includes an access transistor and a semiconductor transistor structure. The semiconductor transistor structure includes a drain overlap region and a channel region. The channel region has an n-type well doping characteristic and the drain overlap region is coupled to the access transistor. A breakdown condition of the semiconductor transistor structure is indicative of a stored data value.

In another particular embodiment, a method includes applying a programming voltage to a source of an access transistor. A drain of the access transistor is coupled to a source region of a semiconductor transistor structure. The method further includes applying a first voltage to a gate of the semiconductor transistor structure and applying a second voltage to a (well) terminal of the semiconductor transistor structure to bias a channel region of the semiconductor transistor structure. The first voltage and the second voltage are substantially equal or much less than gate dielectric breakdown voltage.

One particular advantage provided by at least one of the disclosed embodiments is an ability to reduce an amount of leakage current of a programmable semiconductor transistor structure caused by over-stressing the source and/or drain regions of the semiconductor transistor structure. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 8:
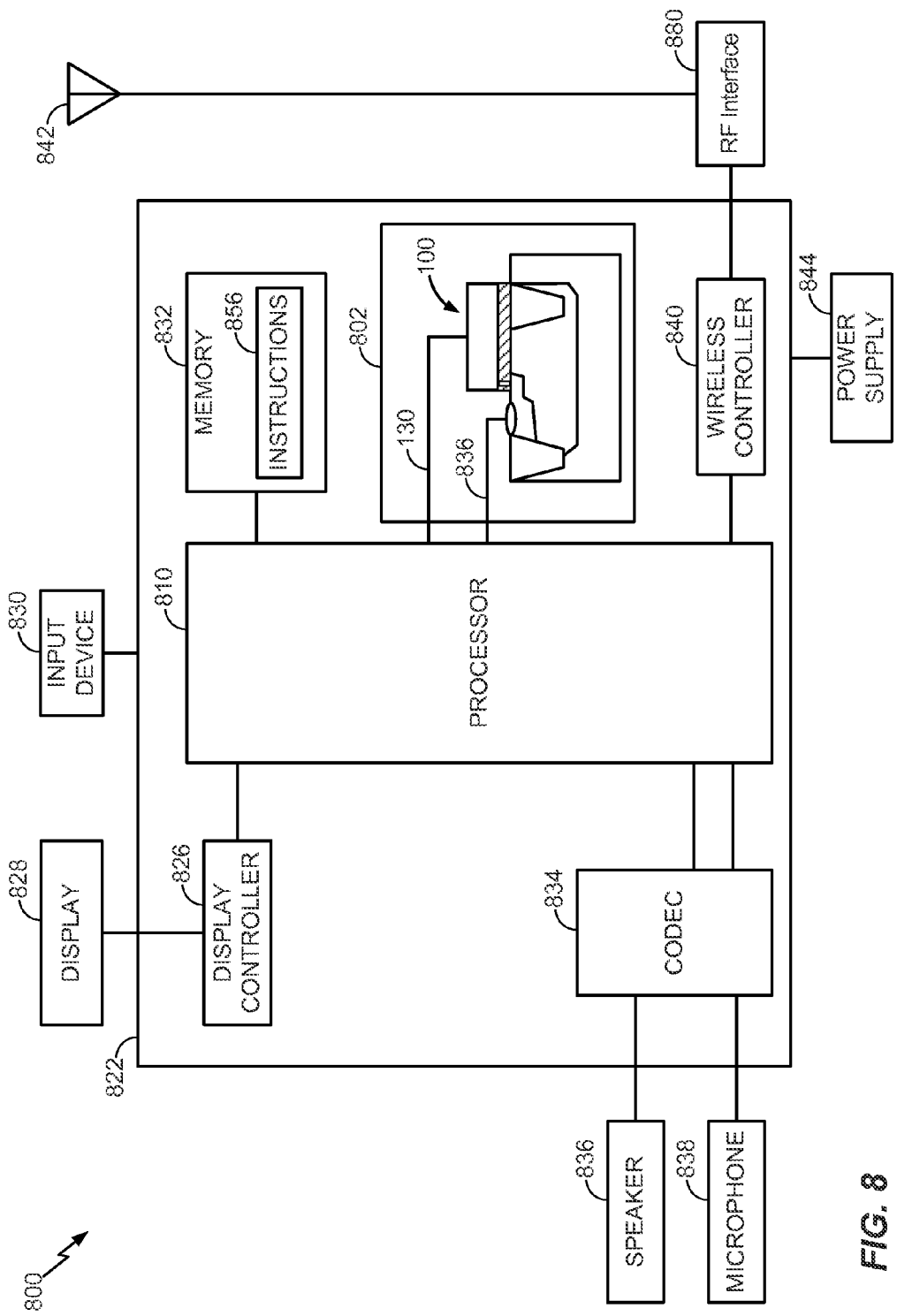
Figure 9:
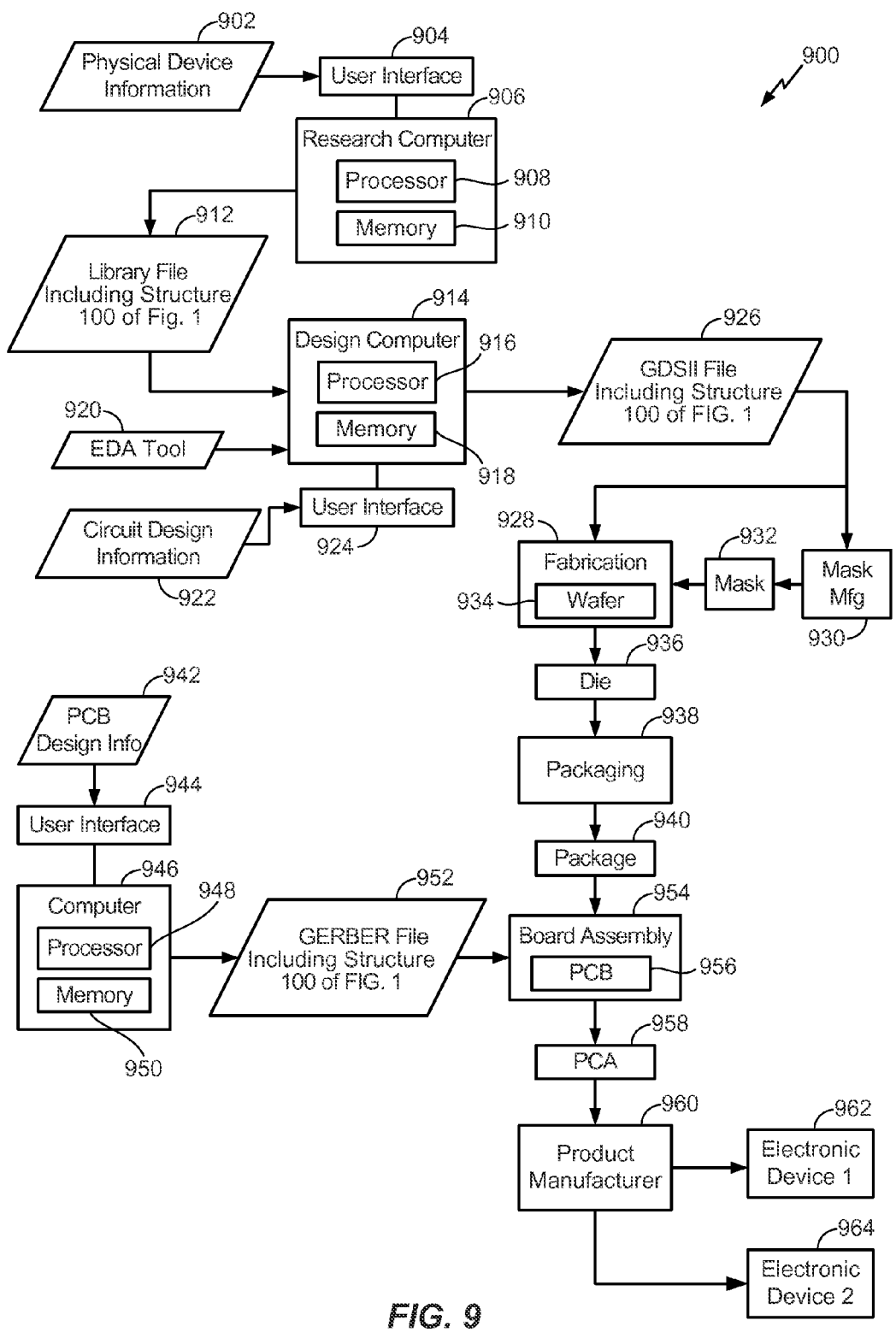

FIG. 8 is a block diagram of a wireless device including a component that is operable to create a breakdown condition at a semiconductor transistor structure; and FIG. 9 is a data flow diagram of a particular illustrative embodiment of a manufacturing process to manufacture electronic devices that include a component that is operable to create a breakdown condition at a semiconductor transistor structure.

V. DETAILED DESCRIPTION

Figure 1:
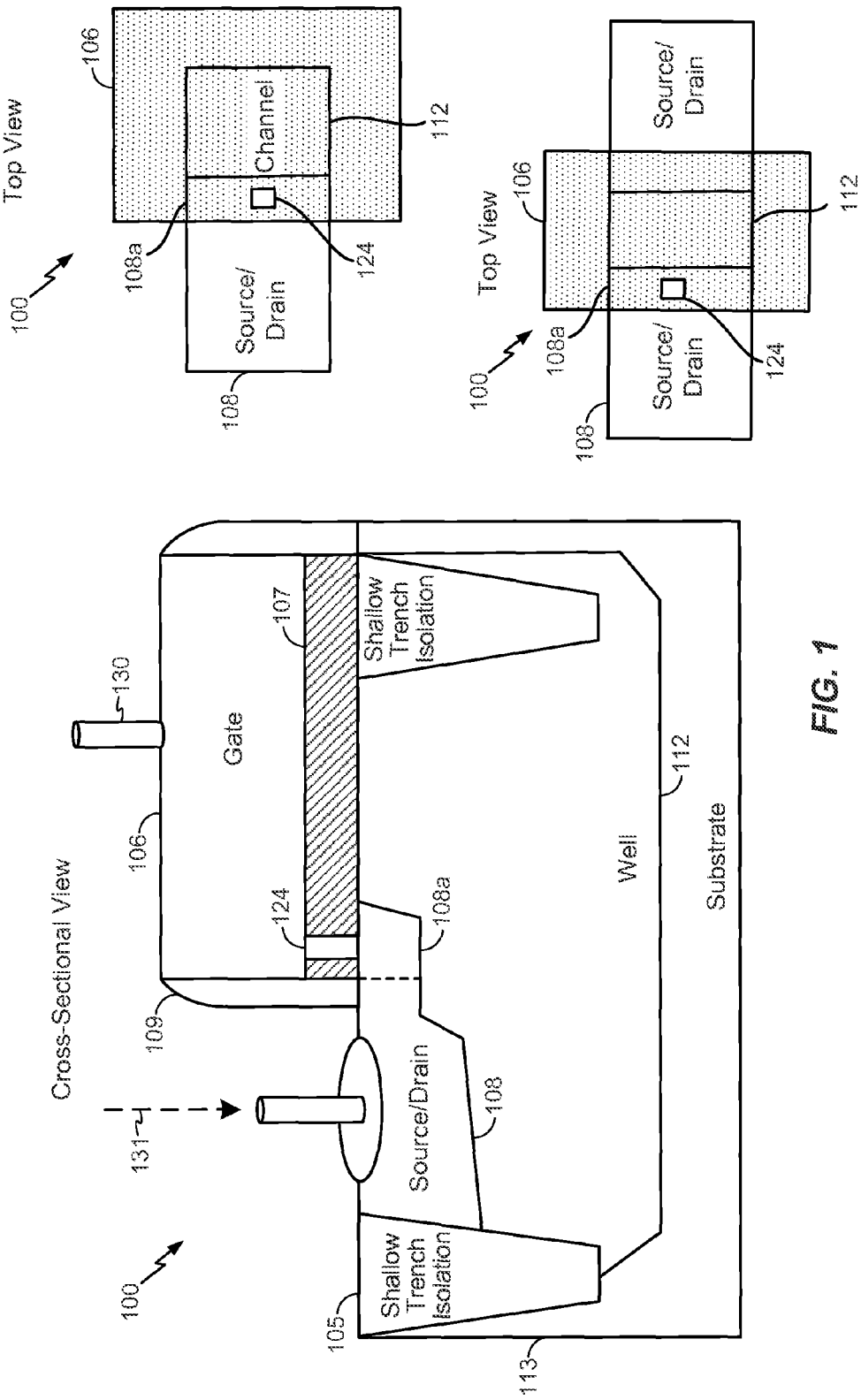
FIG. 1 is a diagram of a particular illustrative embodiment of a semiconductor transistor structure that is biased to generate a programmable breakdown condition between a gate and an overlap region.

Referring to FIG. 1, a particular illustrative embodiment of a semiconductor transistor structure 100 that is biased to generate a programmable breakdown condition between a gate and an overlap region is shown. A cross-sectional view of the semiconductor transistor structure 100 and a top view of the semiconductor transistor structure 100 are shown. In a particular embodiment, the semiconductor transistor structure 100 may include a p-type metal oxide semiconductor (PMOS) transistor or a p-type high-k gate dielectric metal gate transistor. In another particular embodiment, the semiconductor transistor structure 100 may include an n-type metal oxide semiconductor (NMOS) transistor or an n-type high-k gate dielectric metal gate transistor.

The semiconductor transistor structure 100 includes a gate 106, a source/drain region 108, and a well 112 (i.e., a channel region). A dielectric 107 separates the gate 106 from the source/drain region 108 and from the well 112. The dielectric 107 may be an insulating layer comprised of a material with a high dielectric constant. An overlap region 108a may correspond to a particular area of the source/drain region 108 that extends under the gate 106 and the dielectric 107. The overlap region 108a may have a lightly doped concentration as opposed to a source/drain region 108 with a heavily doped concentration. For example, if the source/drain region 108 is doped with an N+ concentration, the overlap region 108a may have a lightly doped N+ concentration as compared to the remaining area of the source/drain region 108 for NMOS. As another example, if the source/drain region 108 is doped with a P+ concentration, the overlap region 108a may have a lightly doped P+ concentration as compared to the remaining area of the source/drain region 108 for PMOS. The gate 106 may be the same type as the source/drain region 108 or may be a reverse type of the source/drain region 108, i.e., an NMOS gate type can be N+, N, or P type metal gate, and a PMOS gate type can be P+, P, or N type metal gate.

The semiconductor transistor structure 100 further includes a spacer layer 109 that is configured to separate the source/drain region 108 from the gate 106. The well 112 corresponds to a region of the semiconductor transistor structure 100 where a metal oxide semiconductor field effect transistor (MOSFET) (i.e., the PMOS transistor or the NMOS transistor) is implanted. The well 112 may have opposite doping characteristics of the source/drain region 108. For example, when the source/drain region 108 has a P+ concentration, the well 112 may have an N− concentration. As another example, when the source/drain region 108 has an N+ concentration, the well 112 may have a P− concentration. A channel region may be formed within the well 112 between the source/drain region 108 and a second source/drain region (not shown) located at the opposite end of the gate 106. For example, a channel (i.e., a conduction path) may be formed within the well 112 that connects the source/drain region 108 with the second source drain region.

The semiconductor transistor structure 100 further includes a shallow trench isolation area 105 that provides isolation and prevents electrical current leakage between adjacent semiconductor device components. For example, the semiconductor transistor structure 100 may be one of a plurality of adjacent semiconductor transistor structures in a memory, each semiconductor transistor structure corresponding to a single memory cell. The shallow trench isolation area 105 may prevent current leakage (from another semiconductor transistor structure in the memory) from affecting the semiconductor transistor structure 100 shown in FIG. 1. The semiconductor transistor structure 100 further includes a substrate 113. The well 112 and the shallow trench isolation area 105 are formed within the substrate 113. Components of the plurality of adjacent semiconductor transistor structures in the memory may also be formed within the substrate 113. In a particular embodiment, the substrate 113 may be doped with a P− concentration.

During operation, a breakdown condition 124 may be created at the semiconductor transistor structure 100 by causing a first voltage difference between the gate 106 and the overlap region 108a to exceed a breakdown voltage of the gate dielectric 107 of the semiconductor transistor structure 100. The breakdown condition 124 corresponds to a breakdown (i.e., a creation of a conductivity path) through the dielectric 107 between the gate 106 and the overlap region 108a. Creation of a conductivity path between the gate 106 and the well 112 can be prevented by maintaining a second voltage difference between the gate 106 and the channel region (i.e., the well 112) at less than the breakdown voltage of the semiconductor transistor structure 100.

The breakdown condition 124 may correspond to a logical value that is programmed (and read) at a one-time-programmable (OTP) device that includes the semiconductor transistor structure 100. For example, in a particular embodiment, the creation of the breakdown condition 124 may correspond to the OTP device storing a logical "1" value as opposed to a logical "0" value. In an alternated embodiment, the creation of the breakdown condition 124 may correspond to the OTP device storing a logical "0" value as opposed to a logical "1" value.

In a first particular embodiment, the semiconductor transistor structure 100 may include an NMOS transistor and the source/drain region 108 may be doped with an N+ concentration, the overlap region 108a being doped with a lighter N+ concentration. As explained with respect to FIGS. 2-3, in this particular embodiment, the breakdown condition 124 may correspond to a programming operation at the NMOS transistor. A gate voltage may be applied to the gate 106 via a first word line 130 and a program voltage may be applied to the source/drain region 108 (and thus the overlap region 108a) via a current 131 flowing through an access transistor. The program voltage will be applied through the access transistor and may be reduced by a threshold voltage of the access transistor, as explained with respect to FIG. 2. The program voltage applied via the current 131 is greater than the gate voltage applied via the first word line 130. As further explained with respect to FIGS. 2-3, in this particular embodiment, the second voltage difference between the gate 106 and the well 112 may be maintained at less than the dielectric 107 breakdown voltage of the semiconductor transistor structure 100 by applying a well voltage to a body (i.e., to the well 112)

of the NMOS transistor via a well tag line (not shown). The well voltage may be approximately equal to the gate voltage. For example, as explained with respect to FIG. 2, the gate voltage may be biased to approximately ground via a word line and the well voltage may be biased to approximately ground via a word line.

In a second particular embodiment, the semiconductor transistor structure 100 includes a PMOS transistor and the source/drain region 108 may be doped with a P+ concentration, the overlap region 108a being doped with a lighter P+ concentration. As explained with respect to FIGS. 4-5, in this particular embodiment, the breakdown condition 124 corresponds to a programming operation at the PMOS transistor. A program voltage may be applied to the gate 106 via the first word line 130 and a source/drain voltage may be applied to the overlap region 108a via an access transistor to connect to a low voltage. The source/drain voltage may be approximately equal to a threshold voltage of the access transistor. As further explained with respect to FIGS. 4-5, in this particular embodiment, the second voltage difference between the gate 106 and the well 112 may be maintained at less than the dielectric 107 breakdown voltage by applying a well voltage to a body (i.e., to the well 112 or channel region) of the PMOS transistor via the well tag line. The difference between the program voltage applied to the gate 106 and the well voltage applied to the body is less than the dielectric 107 breakdown voltage, and a difference between the program voltage and the source/drain voltage is larger than the dielectric 107 breakdown voltage. For example, as explained with respect to FIG. 4, the gate voltage may be biased to a programming voltage via a word line and the well voltage may be biased to approximately a supply voltage (Vdd) (i.e., a regular applied power voltage) via another word line.

It will be appreciated that creation of the breakdown condition 124 between the gate 106 and the overlap region 108a of the semiconductor transistor structure 100 of FIG. 1 may prevent over-stressing of the source/drain region 108 during a reading operation. For example, as explained with respect to FIGS. 2 and 4, a lower read voltage may be applied to the semiconductor transistor structure 100 to read the stored logical value when the breakdown condition 124 is between the gate 106 and the overlap region 108a as compared to if the breakdown condition 124 were between the gate 106 and the well 112 (i.e., the channel region) due to a small breakdown resistance variation and maintained high speed sensing. A lower read voltage may reduce stress in a breakdown path (i.e., the path formed by the breakdown condition 124) and the source/drain overlap region 108a and may reduce an amount of leakage current at the source/drain region 108. It will also be appreciated that a lower read voltage may reduce power consumption as compared to a larger read voltage. Creation of the breakdown condition 124 may permit bi-directional sensing of the logic value to provide more circuit design flexibility due to a linear breakdown resistance and may not require the semiconductor transistor structure 100 to work in channel inversion mode. For example, sensing may be from a gate side of the semiconductor transistor structure 100 or from a source/drain side of the semiconductor transistor structure 100.

Figure 2:
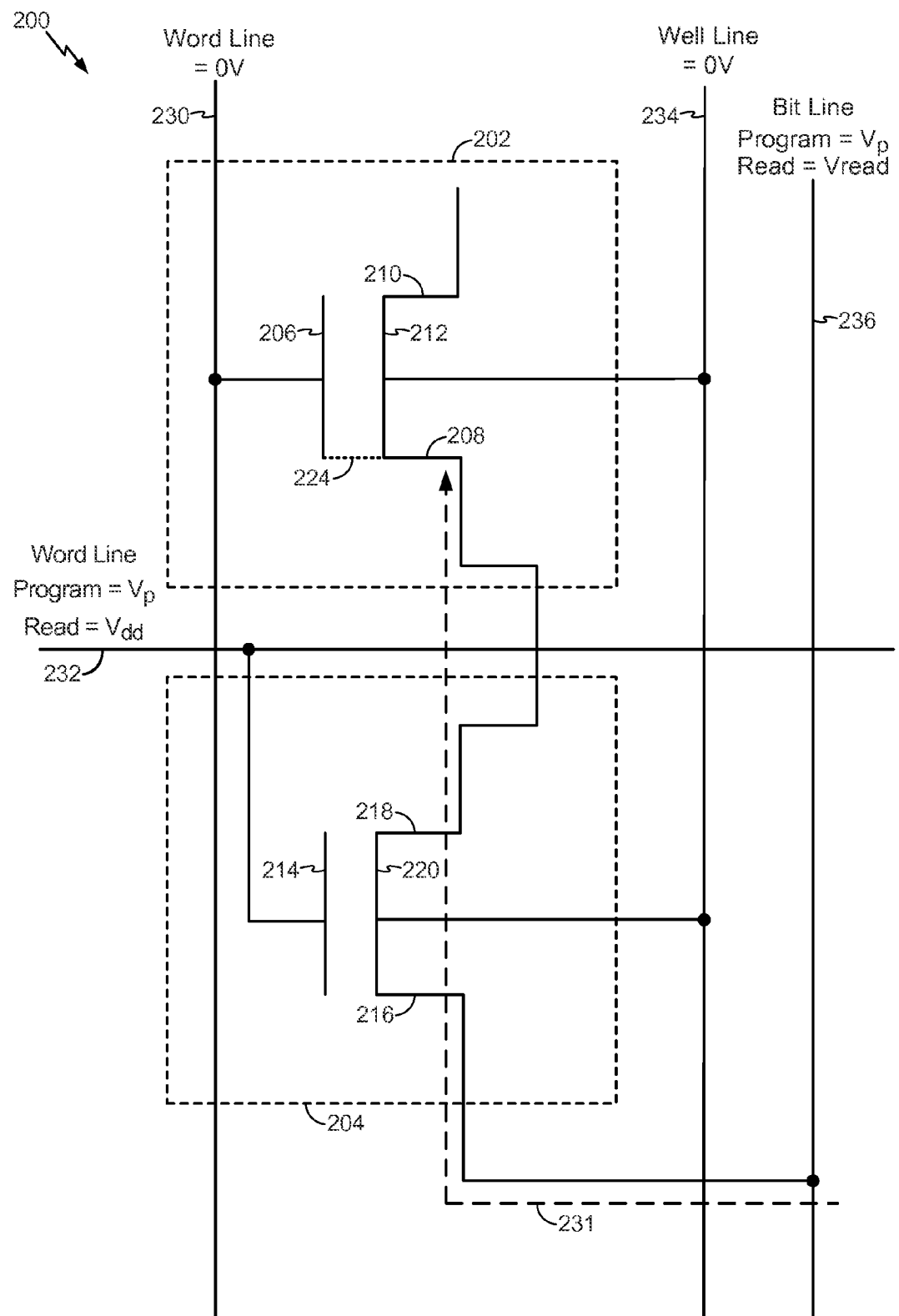
FIG. 2 is a diagram of a particular illustrative embodiment of a circuit that is operable to create a breakdown condition at a semiconductor transistor structure.

Referring to FIG. 2, a particular illustrative embodiment of a circuit 200 that is operable to create a breakdown condition at a semiconductor transistor structure is shown. The circuit 200 may be a circuit of a one-time-programmable (OTP) device (i.e., an n-type OTP device) that includes a semiconductor transistor structure 202 and an access transistor 204. The semiconductor transistor structure 202 may be a first NMOS transistor and the access transistor 204 may be a second NMOS transistor. The first NMOS transistor may be a core transistor which has a lower breakdown voltage than the second NMOS transistor (i.e., an IO transistor). The semiconductor transistor structure 202 of FIG. 2 may be a particular embodiment of the semiconductor transistor structure 100 of FIG. 1.

The semiconductor transistor structure 202 (i.e., the first NMOS transistor) includes a first gate 206, a first drain 208, a first source 210, and a first channel region 212. The access transistor 204 (i.e., the second NMOS transistor) includes a second gate 214, a second drain 216, a second source 218, and a second channel region 220. The first drain 208 of the first NMOS transistor is coupled to receive a source voltage/current (e.g., current 231, illustrated as a dashed line) from the second source 218 of the second NMOS transistor.

The first gate 206 is coupled to a first word line 230 and is responsive to a voltage of the first word line 230. For example, a drain-to-source will be isolated and has a high resistance of the first NMOS transistor as the voltage of the first word line 230 is below threshold voltage. The second gate 214 is coupled to a second word line 232 and is responsive to a voltage of the second word line 232. For example, a drain-to-source conductivity of the second NMOS transistor may increase as the voltage of the second word line 232 increases above a threshold voltage. The first channel region 212 (i.e., P well) of the first NMOS transistor is coupled to a well line 234 and the second channel region 220 (i.e., P well) of the second NMOS transistor is coupled to the well line 234. The second drain 216 of the second NMOS transistor is coupled to a bit line 236.

During a programming operation, the circuit 200 creates a breakdown condition 224 at the semiconductor transistor structure 202 (i.e., the first NMOS transistor). The breakdown condition 224 corresponds to a dielectric breakdown (i.e., creation of a conductivity path in a dielectric) between the first gate 206 and a drain overlap region of the first NMOS transistor. The drain overlap region of the first NMOS transistor corresponds to a region of the first drain 208 extending under the gate dielectric with a lightly doped N+ concentration (as opposed to a region with a heavily doped N+ concentration).

The breakdown condition 224 (at the first drain 208 as opposed to at the first channel region 212) may be created by causing a first voltage difference between the first gate 206 and the drain overlap region (i.e., the first drain 208) to exceed a breakdown voltage of the semiconductor transistor structure 202 while maintaining a second voltage difference between the first gate 206 and the first channel region 212 at less than the breakdown voltage. The breakdown condition 224 may correspond to the breakdown condition 124 of FIG. 1.

Causing the first voltage difference between the first gate 206 and the first drain 208 may include applying a gate voltage to the first gate 206 and applying a program voltage to the first drain 208, but not to the first source 210 or to the first channel region 212, via the access transistor 204. The program voltage may be greater than the gate voltage and large enough to cause a dielectric breakdown between the first gate 206 and the first drain 208. For example, the first word line 230 may apply a gate voltage that is approximately equal to ground (i.e., zero volts) to the first gate 206 of the NMOS transistor. A system programming voltage (Vp) may be applied to the second gate of the access transistor 204 via the second word line 232 and to the second drain 216 of the access transistor 204 via the bit line 236. The well tag line 234 may apply a well voltage approximately equal to ground (i.e., zero volts) to the body contacts of the semiconductor transistor structure 202 and the access transistor 204. As a result, a gate-to-drain or source voltage ($V_{gd2}$, $V_{gs2}$) of the access transistor 204 is approximately zero and Vp−Vt (e.g., $V_{gd2}$=Vp−Vp, $V_{gs2}$=Vp−Vt) but conduction is enabled through the second channel region 220 of the access transistor 204 due to the voltage difference between the second gate 214 (Vp) and the body bias (ground). Because the second transistor (i.e., the access transistor 204) may be an IO transistor and may have a higher breakdown voltage than the first transistor (i.e., the semiconductor transistor structure 202), the second transistor may not breakdown at the second source 218. The program voltage (e.g., the system programming voltage (Vp) minus a threshold voltage (Vt) of the access transistor 204) is provided to the first drain 208 of the semiconductor transistor structure 202 (i.e., the first NMOS transistor). The first transistor may be a core transistor which may have a low breakdown voltage.

The breakdown condition 224 occurs between the drain overlap region and the first gate 206 in response to the first voltage difference between the first gate 206 and the first drain 208 exceeding the breakdown voltage. Thus, a current 231 flows along a program path from the bit line 236 through the access transistor 204 to the first drain 208, and across the gate oxide to the first gate 206 of the semiconductor transistor structure 202. As explained below, the breakdown condition 224 may correspond to a logical value that may be read at the circuit 200 (i.e., the OTP device).

The second voltage difference between the first gate 206 and the first channel region 212 may be maintained at less than the breakdown voltage as a result of the well voltage biasing the first channel region 212. For example, the well line 234 may apply a well voltage that is approximately equal to ground (i.e., zero volts) to the first channel region 212 of the semiconductor transistor structure 202 while the gate voltage applied to the first gate 206 is also approximately equal to ground so that a breakdown may be prevented from occurring at the first channel region 212 due to the second voltage difference (i.e., the gate voltage minus the well voltage) being less than the breakdown voltage.

After the breakdown condition 224 is created, a reading operation at the semiconductor transistor structure 202 may be performed. Performing the reading operation may include applying a read voltage to the drain overlap region (i.e., the first drain 208) by biasing the bit line 236 at a system read voltage ($V_{read}$) and biasing the second word line 232 at a system supply voltage (Vdd) while first word line 230 and the well line 234 are grounded, where the system read voltage ($V_{read}$) is less than the system programming voltage (Vp) and the system supply voltage (Vdd) to prevent an oxide breakdown of un-programmed cells and to prevent over-stressing the breakdown condition 224 by an excess read voltage. The reading (i.e., sensing) operation may be performed in the opposite direction of the current 231 by maintaining the first word line 230 at the read voltage ($V_{read}$) while the second word line 232 is biased at the system supply voltage (Vdd) and the bit line 236 is grounded.

In an alternate embodiment, a breakdown condition may be created at the first source 210 of the semiconductor transistor structure 202 by causing a voltage difference between the first gate 206 and the first source 210 to exceed the breakdown voltage. In this particular embodiment, causing the voltage difference may include applying the gate voltage to the first gate 206 and applying the program voltage to the first source 210, but not to the first drain 208 or to the first channel region 212, via an access transistor coupled to the first source 210.

It will be appreciated that because the breakdown condition 224 is between the first gate 206 and the source overlap region, a lower read voltage may be applied to read the stored logical value as opposed to if a gate oxide breakdown occurred in the first channel region 212 due to a lower linear resistance as compared to a higher bipolar resistance to maintain sensing performance. For example, in a particular embodiment, the system read voltage ($V_{read}$) may be less than 100 millivolts (mV). It will be appreciated that a lower system read voltage ($V_{read}$) may prevent over-stressing the first drain 208 and may also reduce power consumption as compared to a larger read voltage.

Figure 3:
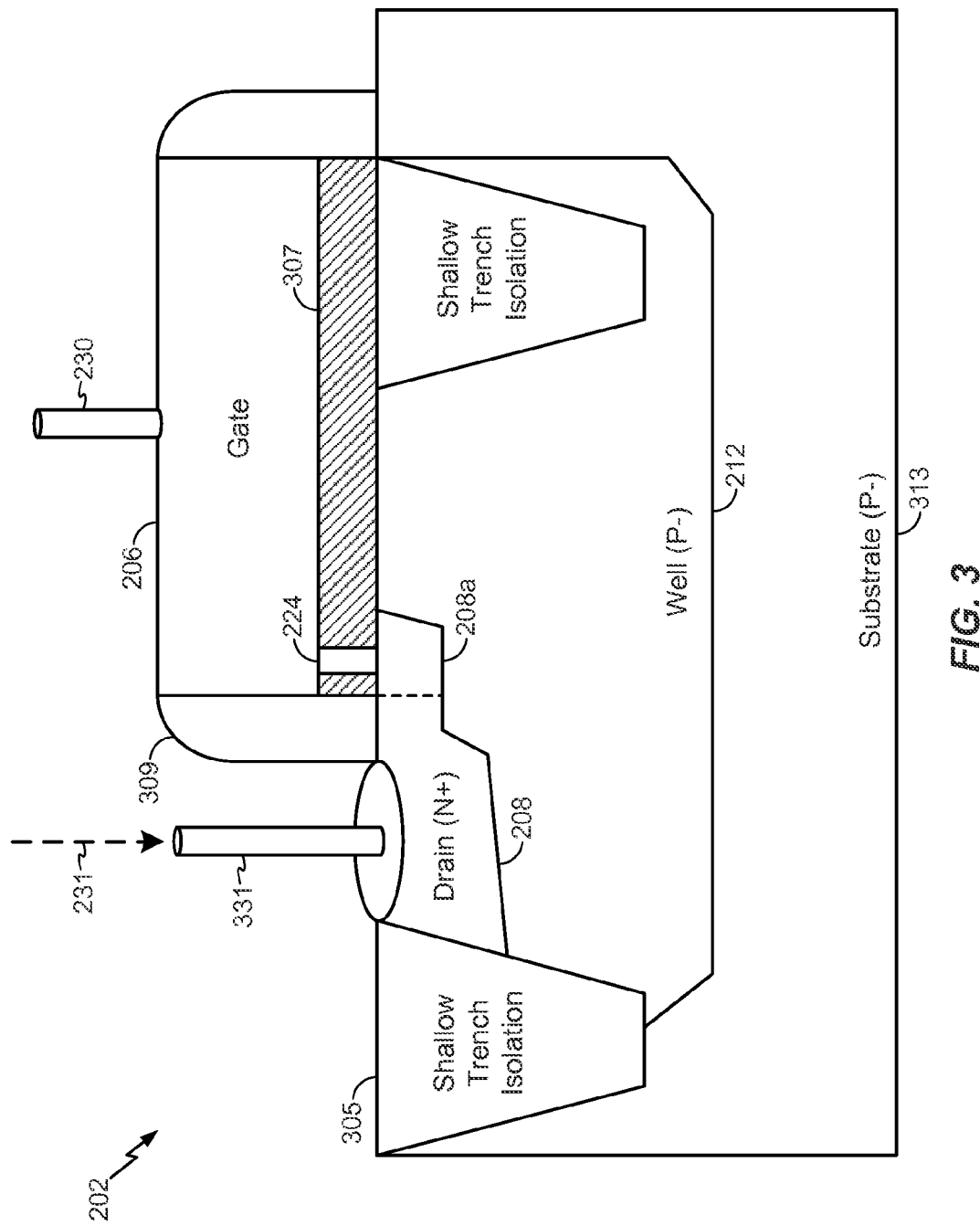
FIG. 3 is a diagram of a particular illustrative embodiment of the semiconductor transistor structure of FIG. 2.

Referring to FIG. 3, a particular illustrative embodiment of the semiconductor transistor structure 202 (i.e., the first NMOS transistor) of FIG. 2 is shown. The semiconductor transistor structure 202 includes the first gate 206, the first drain 208, and the first channel region 212 (i.e., a well). A drain overlap region 208a is depicted in FIG. 3 and may correspond to the drain overlap region described with respect to FIG. 2. A dielectric 307 separates the first gate 206 from the first drain 208, the drain overlap region 208a, and the first channel region 212.

The first channel region 212 may be a channel region between the first drain 208 and the first source 210 of FIG. 2. For example, a channel (i.e., a conduction path) may be established within the first channel region 212 that connects the first drain 208 with the first source 210 (not shown in FIG. 3). The first channel region 212 may have opposite doping characteristics of the first drain 208 (and the first source 210). For example, the first drain 208 has an N+ concentration and the first channel region 212 has a P− concentration. The gate 206 can be N+ type, or N or P metal gate type, etc.

The semiconductor transistor structure 202 includes a spacer layer 309 that is configured to separate the first drain 208 from the first gate 206. The spacer layer 309 may correspond to the spacer layer 109 of FIG. 1 and may operate in a substantially similar manner as the spacer layer 109 of FIG. 1. The semiconductor transistor structure 202 further includes a shallow trench isolation area 305 that provides isolation and prevents electrical current leakage between adjacent semiconductor device components. The shallow trench isolation area 305 may correspond to the shallow trench isolation area 105 of FIG. 1 and may operate in a substantially similar manner as the shallow trench isolation area 105 of FIG. 1. The semiconductor transistor structure 202 further includes a substrate 313. The first channel region 212 and the shallow trench isolation area 305 are formed within the substrate 313. The substrate 113 is doped with a P− concentration. The substrate 313 may correspond to the substrate 113 of FIG. 1 and may function in a substantially similar manner as the substrate 113 of FIG. 1.

In a first particular embodiment, the first gate 206 may be comprised of an N type Metal or of an N+ concentration. During the programming operation of the first particular embodiment, the first word line 230 may apply the gate voltage to the first gate 206 and the program voltage may be applied to the first drain 208 via a source connection 331. For example, the current 231 may be applied to the first drain 208 via the drain connection 331. The gate voltage may be approximately zero volts and the well line 234 of FIG. 2 may apply a well voltage of approximately zero volts to the first channel region 212. Thus, the breakdown condition 224 (i.e., program path) is from the first gate 206 to the first drain 208 (i.e., drain overlap region 208a) as opposed to from the first gate 206 to the first channel region 212 because the gate-to-drain voltage (e.g., approximately equal to the program voltage) is higher than the gate-to-well voltage (e.g., zero volts).

During the reading operation of the first particular embodiment, the read path (i.e., the breakdown condition 224) is from the first gate 206 to the first drain 208 (i.e., drain overlap region 208a). The gate voltage may be approximately zero and the read voltage may be applied to the first drain 208 via the drain connection 331. As explained with respect to FIG. 2, a reduced system read voltage ($V_{read}$) (e.g., 100 mV) may be used to avoid over-stressing the first drain 208. The reading (i.e., sensing) operation may be performed in a reverse direction by applying the read voltage to the gate 206 and applying a voltage approximately equal to zero volts to the drain 208.

In a second particular embodiment, the first gate 206 may be comprised of a P type Metal. The programming operation of the second particular embodiment may function in a similar manner as the programming operation of the first particular embodiment. The reading operation of the second particular embodiment may function in a similar manner as the reading operation of the first particular embodiment.

The semiconductor transistor structure 202 shown in FIG. 3 may be implemented in the circuit 200 of FIG. 2. It will be appreciated that in the first particular embodiment of the semiconductor transistor structure 202 described with respect to FIG. 3, the system programming voltage (Vp) applied to the second gate 214 of the access transistor 204 and to the second drain 216 of the access transistor 204 of FIG. 2 may be higher than the system programming voltage (Vp) in the second particular embodiment of the semiconductor transistor structure 202 described with respect to FIG. 3. For example, due to the P type Metal composition of the first gate 206 and the N+ concentration of the first drain 208 and the drain overlap region 208a in the second particular embodiment, a lower system programming voltage (Vp) may be required as compared to the first embodiment due to a higher self build electrical field in the second particular embodiment. Reducing the system programming voltage (Vp) may reduce power consumption.

Figure 4:
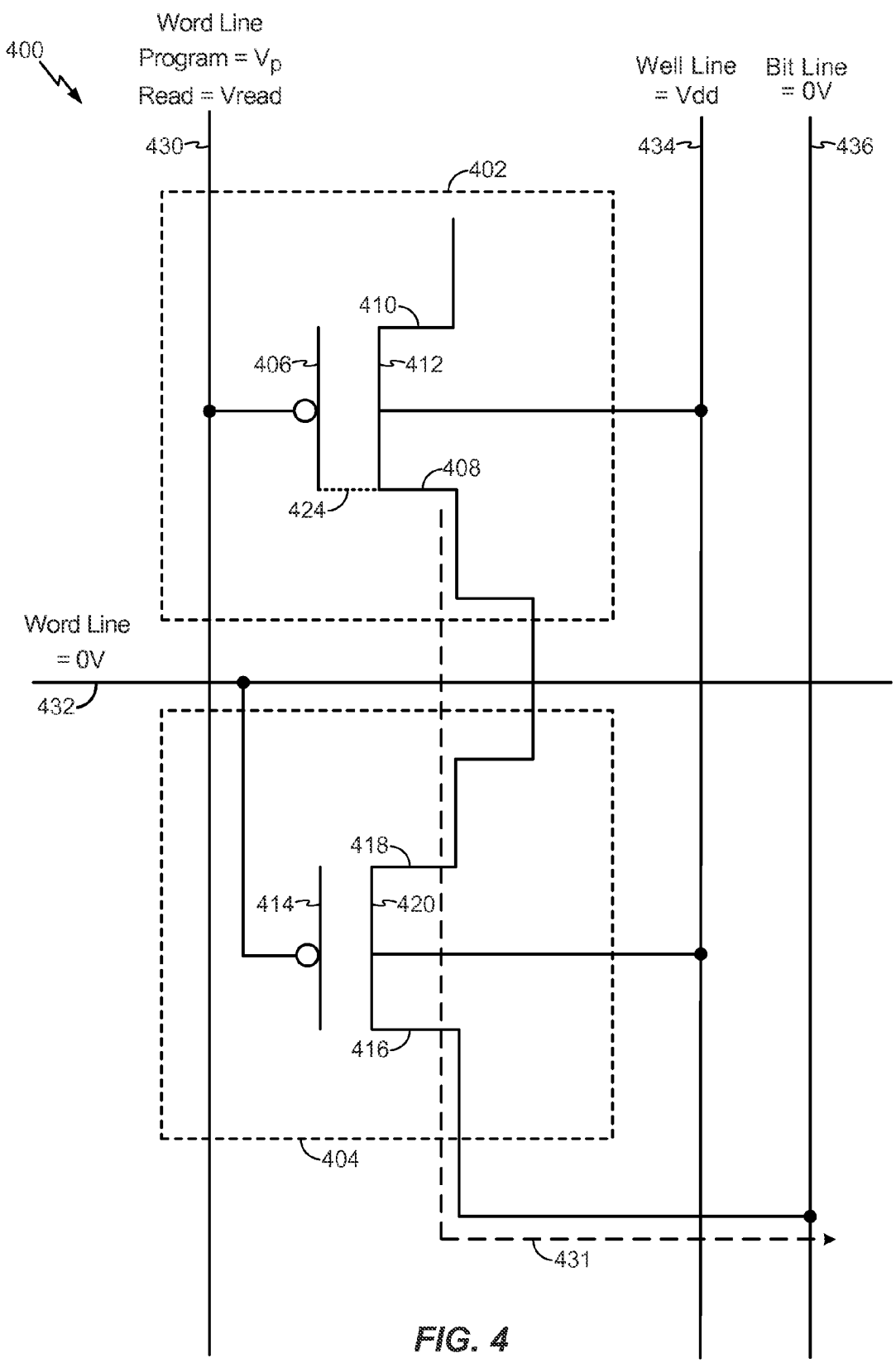
FIG. 4 is another diagram of a particular illustrative embodiment of a circuit that is operable to create a breakdown condition at a semiconductor transistor structure.

Referring to FIG. 4, a particular illustrative embodiment of a circuit 400 that is operable to create a breakdown condition at a semiconductor transistor structure is shown. The circuit 400 may be a circuit of a one-time-programmable (OTP) device (i.e., a p-type OTP device) that includes a semiconductor transistor structure 402 and an access transistor 404. The semiconductor transistor structure 402 may be a first PMOS transistor and the access transistor 404 may be a second PMOS transistor. The first PMOS transistor may be a core transistor which has a lower breakdown voltage than the second PMOS transistor (i.e., an IO transistor). The semiconductor transistor structure 402 of FIG. 4 may be a particular embodiment of the semiconductor transistor structure 100 of FIG. 1.

The semiconductor transistor structure 402 (i.e., the first PMOS transistor) includes a first gate 406, a first drain 408, a first source 410, and a first channel region 412. The access transistor 404 (i.e., the second PMOS transistor) includes a second gate 414, a second drain 416, a second source 418, and a second channel region 420. The first drain 408 of the first PMOS transistor is coupled to provide a drain current (e.g., current 431, illustrated as a dashed line) to the second drain 416 of the second PMOS transistor.

The first gate 406 is coupled to a first word line 430 and is responsive to a voltage of the first word line 430. For example, the first drain 408 and the first source 410 are isolated due to the high resistance of the first PMOS transistor and the voltage of the first word line 430 being below an absolute PMOS threshold voltage. The second gate 414 is coupled to a second word line 432 and is responsive to a voltage of the second word line 432. For example, a drain-to-source conductivity of the second PMOS transistor may increase as the voltage of the second word line 132 decreases below an absolute PMOS threshold voltage. The first channel region 412 of the first PMOS transistor is coupled to a well line 434 and the second channel region 420 of the second PMOS transistor is coupled to the well line 434. The second drain 416 of the second PMOS transistor is coupled to a bit line 436.

During a programming operation, the circuit 400 creates a breakdown condition 424 at the semiconductor transistor structure 402 (i.e., the first PMOS transistor). The breakdown condition 424 corresponds to a breakdown (i.e., creation of a conductivity path) between the first gate 406 and a drain overlap region of the first PMOS transistor. The drain overlap region of the first PMOS transistor corresponds to a region of the first drain 408 extending under the gate dielectric with a lightly doped P+ concentration (as opposed to a region with a heavily doped P+ concentration).

The breakdown condition 424 (at the first drain 408 as opposed to at the first channel region 412) may be created by causing a first voltage difference between the first gate 406 and the drain overlap region (i.e., the first drain 408) to exceed a breakdown voltage of the semiconductor transistor structure 402 while maintaining a second voltage difference between the first gate 406 and the first channel region 412 at less than the breakdown voltage. The breakdown condition 424 may correspond to the breakdown condition 124 of FIG. 1.

Causing the first voltage difference between the first gate 406 and the first drain 408 may include applying a system programming voltage (Vp) to the first gate 406 and applying a drain voltage (e.g., a threshold voltage (Vt)) to the first drain 408, but not to the first source 410 or the first channel region 412, via the access transistor 404. For example, a ground voltage (i.e., zero volts) may be applied to the bit line 436 and the ground voltage may be applied to the second word line 432 to enable conduction of the access transistor 404. A system programming voltage (Vp) may be provided to the first gate 406 by the first word line 430 and a drain voltage (e.g., approximately the threshold voltage (Vt) of the access transistor 404) may be provided to the first drain 408 via the access transistor 404. The well line 434 may provide a system supply voltage (Vdd) to the body contact of the semiconductor transistor structure 402 to bias the first channel region 412 and cause the breakdown condition 424 near the first drain 408 but not in channel region 412 due to Vp−Vdd being less than the breakdown voltage.

The breakdown condition 424 occurs between the drain overlap region and the first gate 406 in response to the first voltage difference between the first gate 406 and the first drain 408 exceeding the breakdown voltage. Thus, a current 431 flows along a program path from the first gate 406, through the first drain 408, through the access transistor 404, and to the bit line 436.

The second voltage difference between the first gate 406 and the first channel region 412 may be maintained at less than the breakdown voltage as result of the well voltage biasing the first channel region 412. For example, the well line 434 may apply the system supply voltage (Vdd) (i.e., the well voltage) to the first channel region 412 of the semiconductor transistor structure while the first word line 430 applies the system programming voltage (Vp) to the first gate 406. Thus, a breakdown may be prevented from occurring at the first channel region 412 due to the second voltage difference (e.g., Vp−Vdd) being less than the breakdown voltage.

After the breakdown condition 424 is created, a reading operation at the semiconductor transistor structure 402 may be performed. Performing the reading operation may include applying a read voltage to the first gate 406. A read path from the first gate 406 to the first drain 408 of the semiconductor transistor structure 402 may be used to read a stored logical value created by the breakdown condition 424. The reading operation may be performed in a reverse direction by applying the read voltage at bit line 436 through the access transistor 404 to the first drain 408, and applying a voltage approximately equal to zero to the first gate 406.

In an alternate embodiment, a breakdown condition may be created at the first source 410 of the semiconductor transistor structure 402 by causing a voltage difference between the first gate 406 and the first source 410 to exceed the breakdown voltage. In this particular embodiment, causing the voltage difference may include applying the system programming voltage (Vp) to the first gate 406 and applying a threshold voltage (Vt) of an access transistor to the first source 410, but not to the first drain 408 or to the first channel region 412, via an access transistor coupled to the first source 410.

It will be appreciated that because the breakdown condition 424 is between the first gate 406 and the drain overlap region, a lower read voltage may be applied to read the stored logical value as opposed to if a gate dielectric breakdown occurred in the first channel region 412. For example, in a particular embodiment, the system read voltage ($V_{read}$) may be less than 100 millivolts (mV). It will also be appreciated that a lower system read voltage ($V_{read}$) may prevent over-stressing the first drain 408a and may also reduce power consumption.

Figure 5:
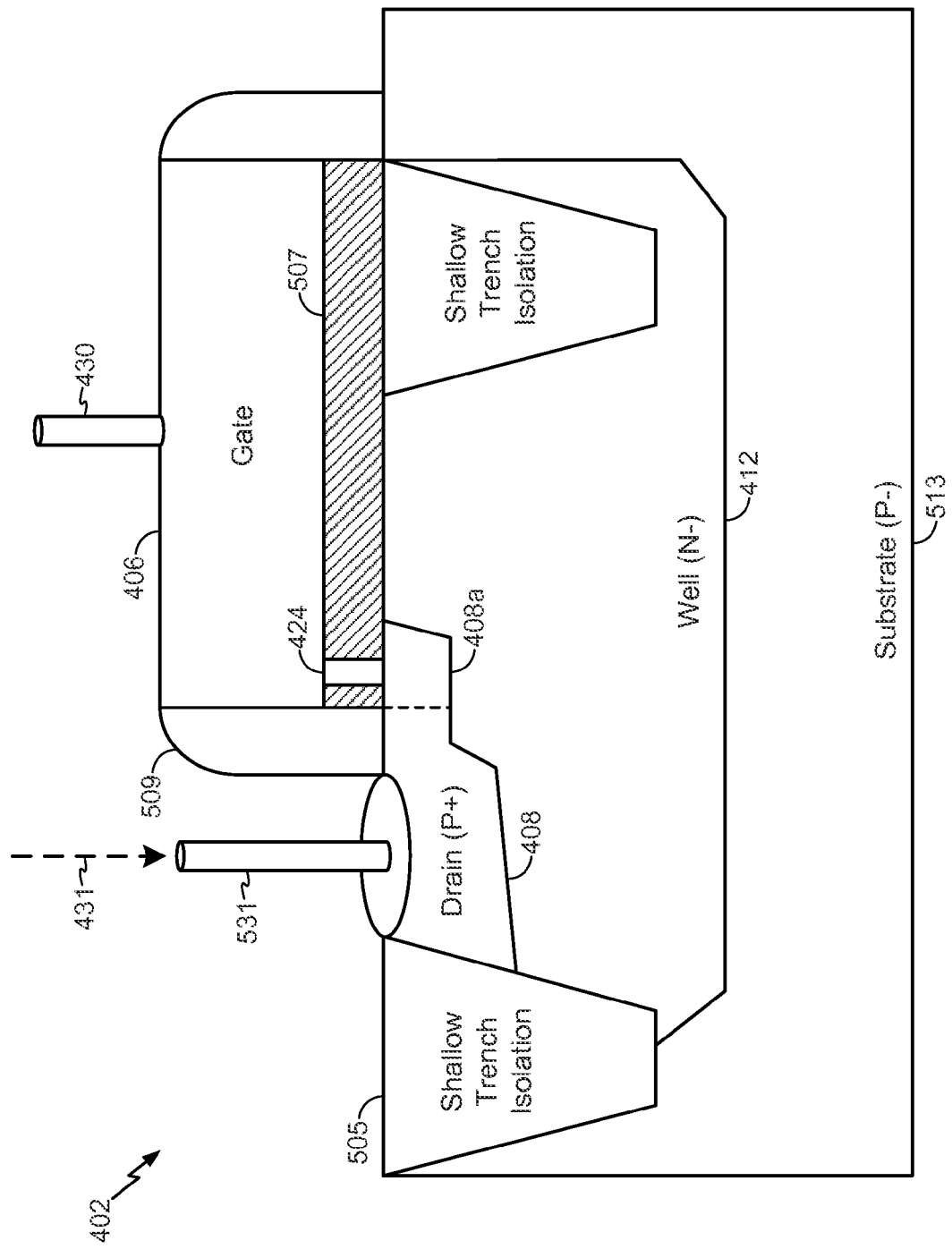
FIG. 5 is a diagram of a particular illustrative embodiment of the semiconductor transistor structure of FIG. 4

Referring to FIG. 5, a particular illustrative embodiment of the semiconductor transistor structure 402 (i.e., the first PMOS transistor) of FIG. 4 is shown. The semiconductor transistor structure 402 includes the first gate 406, the first drain 408, and the first channel region 412 (i.e., an N well). A drain overlap region 408a is depicted in FIG. 5 and may correspond to the drain overlap region described with respect to FIG. 4. A dielectric 507 separates the first gate 406 from the first drain 408, the drain overlap region 408a, and the first channel region 412.

The first channel region 412 may be a channel region between the first drain 408 and the first source 410 of FIG. 4. For example, a channel (i.e., a conduction path) may be established within the first channel region 412 that connects the first drain 408 with the first source 410. The first channel region 412 may have opposite doping characteristics of the first drain 408 (and the first source 410). For example, the first drain 408 has a P+ concentration and the first channel region 412 has an N− concentration.

The semiconductor transistor structure 402 includes a spacer layer 509 that configured to separate the first drain 408 from the first gate 406. The spacer layer 509 may correspond to the spacer layer 109 of FIG. 1 and may operate in a substantially similar manner as the spacer layer 109 of FIG. 1. The semiconductor transistor structure 402 further includes a shallow trench isolation area 505 that provides isolation and prevents electrical current leakage between adjacent semiconductor device components. The shallow trench isolation area 505 may correspond to the shallow trench isolation area 105 of FIG. 1 and may operate in a substantially similar manner as the shallow trench isolation area 105 of FIG. 1. The semiconductor transistor structure 402 further includes a substrate 513. The first channel region 412 and the shallow trench isolation area 505 are formed within the substrate 513. The substrate 513 is doped with a P− concentration. The substrate 513 may correspond to the substrate 113 of FIG. 1 and may function in a substantially similar manner as the substrate 113 of FIG. 1.

In a first particular embodiment, the first gate 406 may be comprised of a P type Metal or of a P+ concentration. During the programming operation of the first particular embodiment, the first word line 430 may apply a gate voltage (i.e., the system programming voltage (Vp)) to the first gate 406 and the drain voltage may be applied to the first drain 408 via a drain connection 531. For example, the current 431 may be applied to the first drain 408 via the first drain connection 531. The well line 434 of FIG. 4 may apply the well voltage approximately equal to the system supply voltage (Vdd) to the first channel region 412. Thus, the breakdown condition 424 (i.e., program path) is from the first gate 406 to the first drain 408 (i.e., drain overlap region 408a) as opposed to from the first gate 406 to the first channel region 412 because the gate-to-drain voltage is higher than the gate-to-well voltage.

During the reading operation of the first particular embodiment, the read path (i.e., the breakdown condition 424) is from the first gate 406 to the first drain 408 (i.e., drain overlap region 408a). The system read voltage ($V_{read}$) may be applied to the first gate 406 and the drain voltage may be applied to the first drain 408 via the drain connection 531. As explained with respect to FIG. 4, a reduced system read voltage ($V_{read}$) (e.g., 100 mV or less) may be used to avoid over-stressing the drain overlap region 408a.

In a second particular embodiment, the first gate 406 may be comprised of an N type Metal. The programming operation of the second particular embodiment may function in a similar manner as the programming operation of the first particular embodiment. The reading operation of the second particular embodiment may function in a similar manner as the reading operation of the first particular embodiment.

It will be appreciated that in the first particular embodiment, the system programming voltage (Vp) applied to the first gate 406 may be higher than the system programming voltage (Vp) in the second particular embodiment. For example, due to the N type Metal composition of the first gate 406 and the P+ concentration of the first drain 408 in the second particular embodiment, a lower system programming voltage (Vp) may be applied as compared to the first embodiment due to a higher self build electric field. Reducing the programming voltage (Vp) may reduce power consumption.

Figure 6:
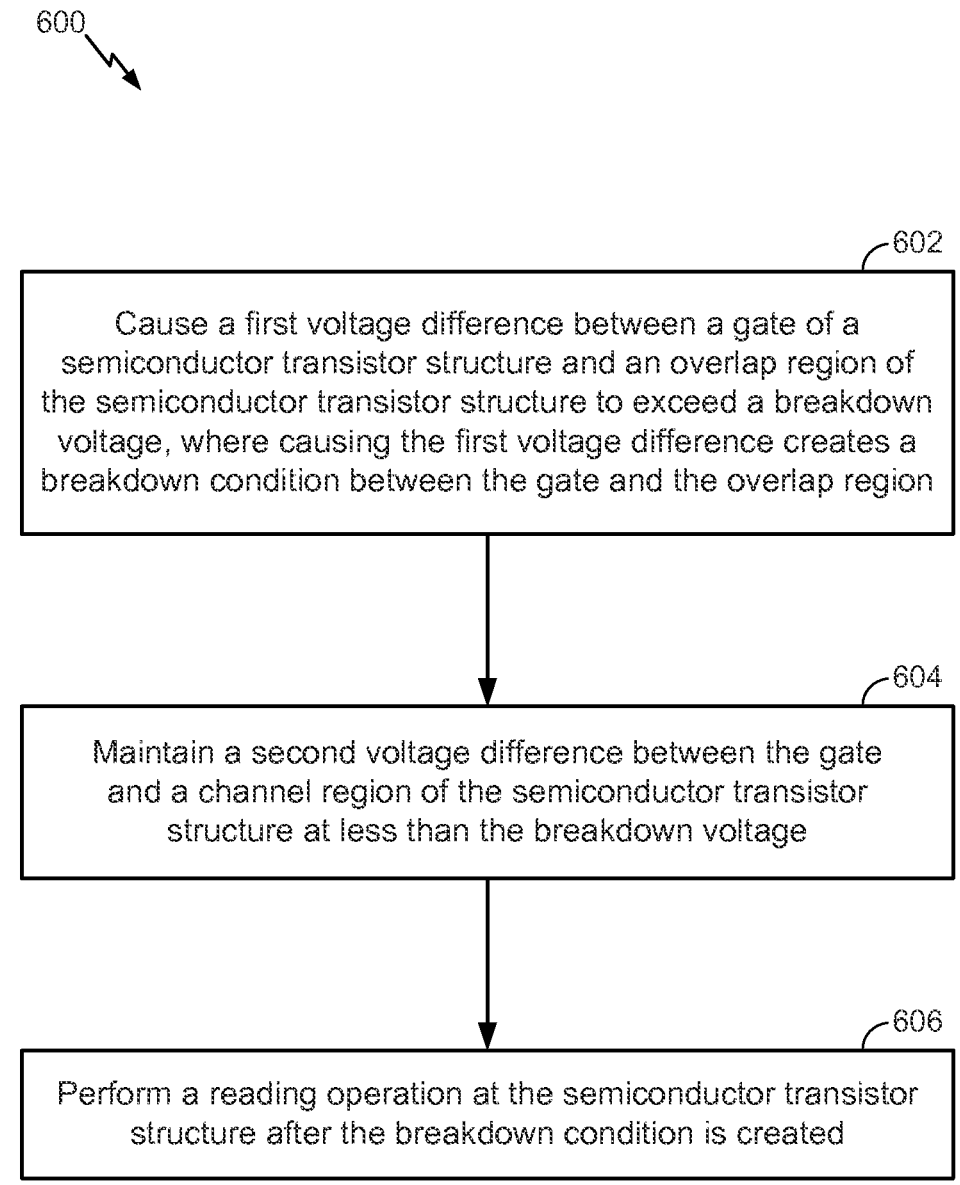
FIG. 6 is a flowchart of a particular embodiment of a method of creating a breakdown condition at a semiconductor transistor structure.

Referring to FIG. 6, a flowchart of a particular embodiment of a method 600 of creating a breakdown condition at a semiconductor transistor structure is shown. In an illustrative embodiment, the method 600 may be performed using the semiconductor transistor structure 100 of FIG. 1, the circuit 200 of FIG. 2, the semiconductor transistor structure 202 of FIG. 3, the circuit 400 of FIG. 4, or the semiconductor transistor structure 402 of FIG. 5.

The method includes causing a first voltage difference between a gate of a semiconductor transistor structure and an overlap region of the semiconductor transistor structure to exceed a breakdown voltage, at 602. For example, in the first particular embodiment of FIG. 1, a gate voltage may be applied to the gate 106 via the first word line 130 and a program voltage may be applied to the overlap region 108a via the current 131 flowing through an access transistor, such as the access transistor 204 of FIG. 2. The program voltage applied via the current 131 may be greater than the gate voltage applied via the first word line, thus creating the first voltage difference between the gate 106 and the overlap region 108a that exceeds the breakdown voltage of the semiconductor transistor structure 100. The first voltage difference may create the breakdown condition 124 between the gate 106 and the overlap region 108a.

As another example, in the second particular embodiment of FIG. 1, a program voltage may be applied to the gate 106 via the first word line 130 and the source/drain voltage may be applied to the overlap region 108a via an access transistor, such as the access transistor 404 of FIG. 4. As described with respect to FIG. 4, the source/drain voltage may be approximately equal to the threshold voltage (Vt) of the access transistor 404 and the program voltage may be equal to the system programming voltage (Vp), thus creating the first voltage difference between the gate 106 and the overlap region 108a that exceeds the breakdown voltage of the semiconductor transistor structure 100.

A second voltage difference between the gate and a channel region of the semiconductor transistor structure may be maintained at less than the breakdown voltage, at 604. For example, in the first particular embodiment of FIG. 1, the second voltage difference between the gate 106 and the well 112 (i.e., the channel region) may be maintained at less than the breakdown voltage by applying a well voltage to the well 112 via, a well line, such as the well line 234 of FIG. 2. The well voltage may be approximately equal to the gate voltage the well voltage and the gate voltage may be approximately equal to ground). Thus, the second voltage difference (e.g., approximately zero volts) may be less than the breakdown voltage of the semiconductor transistor structure 100.

As another example, in the second particular embodiment of FIG. 1, the second voltage difference between the gate 106 and the well 112 may be maintained at less than the breakdown voltage by applying a well voltage to the well 112 via a well line, such as the well line 434 of FIG. 4. The well voltage may be approximately equal to the system supply voltage (Vdd) and, as explained above with respect to the second particular embodiment of FIG. 1, the program voltage applied to the gate 106 may be approximately equal to the system programming voltage (Vp). The second voltage difference (Vp–Vdd) may be less than the breakdown voltage of the semiconductor transistor structure 100.

A reading operation may be performed at the semiconductor transistor structure after the breakdown condition is created, at 606. For example, referring to FIG. 2, performing the reading operation may include applying a read voltage to the drain overlap region (i.e., the first drain 208) by biasing the bit line 236 at a system read voltage ($V_{read}$) and biasing the second word line 232 at a system supply voltage (Vdd) while the first word line 230 and the well line 234 are grounded, where the system read voltage ($V_{read}$) is less than the system programming voltage (Vp) to prevent a dielectric breakdown of un-programmed cells and over-stressing the breakdown path. The reading operation may also be performed in the reverse direction as described above.

As another example, referring to FIG. 4, performing the reading operation may include applying a read voltage to the first gate 406. A read path from the first gate 406 to the first drain 408 of the semiconductor transistor structure 402 may be used to read a stored logical value created by the breakdown condition 424. The reading operation may also be performed in the reverse direction as described above.

It will be appreciated that the method 600 of FIG. 6 may create the breakdown condition 124 between the gate 106 and the overlap region 108a of the semiconductor transistor structure 100 of FIG. 1. Creating the breakdown condition at the overlap region 108a may prevent over-stressing of the source/drain region 108 during a reading operation. For example, a lower read voltage may be applied to the semiconductor transistor structure 100 to read a stored logical value when the breakdown condition 124 is between the gate 106 and the overlap region 108a as compared to if the breakdown condition 24 were between the gate 106 and the well 112 (i.e., the channel region). A lower read voltage may reduce over stress on the source/drain region 108a and it may improve OTP device reliability. It will also be appreciated that a lower read voltage may reduce power consumption as compared to a larger read voltage.

Figure 7:
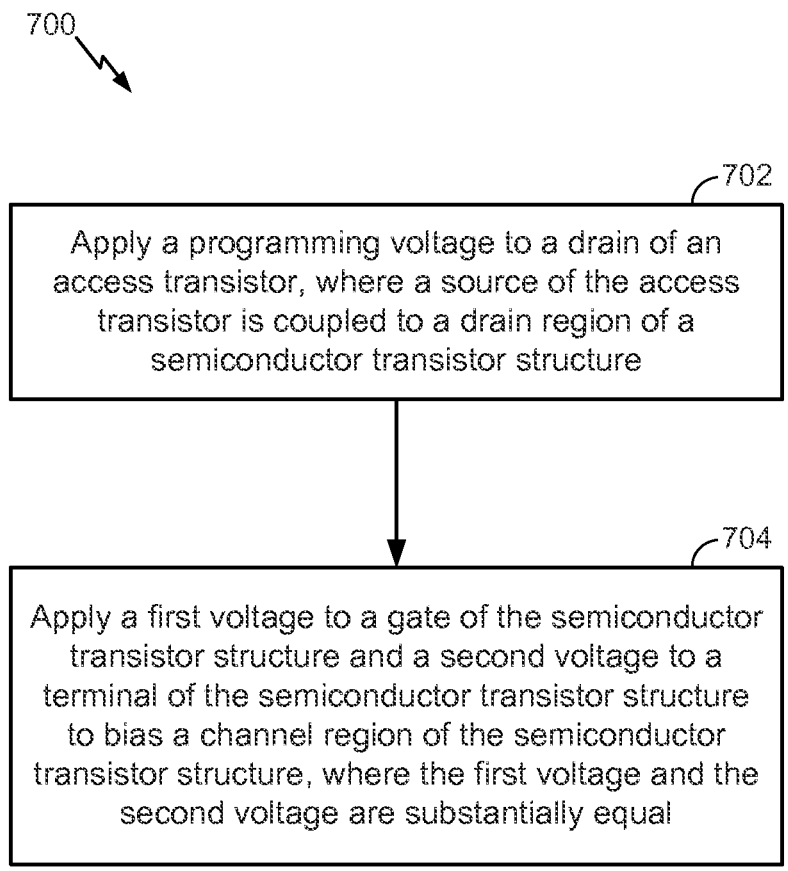
FIG. 7 is another flowchart of a particular embodiment of a method of creating a breakdown condition at a semiconductor transistor structure.

Referring to FIG. 7, a flowchart of another particular embodiment of a method 700 of creating a breakdown condition at a semiconductor transistor structure is shown. In an illustrative embodiment, the method 700 may be performed using the semiconductor transistor structure 100 of FIG. 1, the circuit 200 of FIG. 2, the semiconductor transistor structure 202 of FIG. 3, the circuit 400 of FIG. 4, or the semiconductor transistor structure 402 of FIG. 5.

The method 700 includes applying a programming voltage to a drain of an access transistor, at 702. For example, in FIG. 2, the system programming voltage (Vp) may be applied to the second drain 216 of the access transistor 204 via the bit line 236. The second source 218 of the access transistor 204 may be coupled to the first drain 208 (i.e., a drain region) of the semiconductor transistor structure 202.

A first voltage may be applied to a gate of the semiconductor transistor structure and a second voltage may be applied to a terminal of the semiconductor transistor structure to bias a channel region of the semiconductor transistor structure, at 704. For example, in FIG. 2, the first word line 203 may apply the gate voltage (i.e., a first voltage) that is approximately equal to ground to the first gate 206 of the semiconductor transistor structure 202. The well line 234 may apply the well voltage (i.e., a second voltage) that is approximately equal to ground to the body contact (i.e., the first channel region 212) of the semiconductor transistor structure 202 to bias the first channel region 212. Thus, because the well voltage and the gate voltage are substantially equal (i.e., equal to ground), a breakdown condition may be prevented from being created at the first channel region 212.

It will be appreciated that the method 700 of FIG. 7 may prevent a breakdown condition from being created at the first channel region 212 of the semiconductor transistor structure 202. Preventing a breakdown condition at the first channel region 212 may reduce an amount of stress applied to the first drain 208 and to the first source 210 of the semiconductor transistor structure 202 in response to a system reading voltage ($V_{read}$) applied to the circuit 200 to read a data value corresponding to the channel region breakdown condition.

Referring to FIG. 8, a block diagram of a wireless device 800 including a component that is operable to create a breakdown condition at a semiconductor transistor structure is shown. The device 800 includes a processor 810, such as a digital signal processor (DSP), coupled to a memory 832.

FIG. 8 also shows a display controller 826 that is coupled to the processor 810 and to a display 828. A coder/decoder (CODEC) 834 can also be coupled to the processor 810. A speaker 836 and a microphone 838 can be coupled to the CODEC 834. FIG. 8 also indicates that a wireless controller 840 can be coupled to the processor 810 and to an antenna 842 via a radio-frequency (RF) interface 890 disposed between the wireless controller 840 and the antenna 842. A one-time-programmable (OTP) device 802 may also be coupled to the processor 810. The OTP device 802 may correspond to the circuit 200 of FIG. 2 or the circuit 400 of FIG. 4. In the particular embodiment, the OTP device 802 includes the semiconductor transistor structure 100 of FIG. 1. The semiconductor transistor structure 100 may correspond to the semiconductor transistor structure 202 of FIGS. 2-3 or to the semiconductor transistor structure 402 of FIGS. 4-5.

The memory 832 may be a tangible non-transitory processor-readable storage medium that includes executable instructions 856. The instructions 856 may be executed by a processor, such as the processor 810, to apply a programming voltage to a drain of an access transistor. For example, the processor 810 may control a bias to a bit line 836. In a first particular embodiment, the bit line 836 may correspond to the bit line 836 may correspond to the bit line 236 of FIG. 2 and the OTP device 802 may correspond to the circuit 200 of FIG.

2. Thus, in the first particular embodiment, the processor 810 may control a bias to the bit line 236 that is coupled to the second drain 216 of the access transistor 204 at the system programming voltage (Vp). The second source 218 of the access transistor 204 may be coupled to the source/drain region 108 of the semiconductor transistor structure 100. In a second particular embodiment, the bit line 836 may correspond to the bit line 436 of FIG. 4 and the OTP device 802 may correspond to the circuit 400 of FIG. 4. Thus, in the second particular embodiment, the processor 810 may control a bias to the bit line 436 that is coupled to the second drain 416 of the access transistor 404 at approximately ground. The second source 418 may be coupled to the source/drain region 108 of the semiconductor transistor structure 100.

The instructions 856 may also be executable to apply a first voltage to a gate of the semiconductor transistor structure and a second voltage to a terminal of the semiconductor transistor structure to bias a channel region of the semiconductor transistor structure. For example, the processor 810 may bias the first word line 130 coupled to the gate 106 of the semiconductor transistor structure 100 at the first voltage (i.e., a gate voltage). The processor 810 may also bias a well line, such as the well line 234 of FIG. 2 or the well line 434 of FIG. 4, at the second voltage. The well line may be coupled to the well 112 (i.e., a terminal) to bias a channel region (i.e., the first channel region 212, 412) of the semiconductor transistor structure 100. The first voltage and the second voltage may be substantially equal.

The instructions 856 may also be executable by an alternative processor (not shown) coupled to the processor 810.

In a particular embodiment, the processor 810, the display controller 826, the memory 832, the CODEC 834, and the wireless controller 840 are included in a system-in-package or system-on-chip device 822. In a particular embodiment, an input device 830 and a power supply 844 are coupled to the system-on-chip device 822. Moreover, in a particular embodiment, as illustrated in FIG. 8, the display 828, the input device 830, the speaker 836, the microphone 838, the antenna 842, and the power supply 844 are external to the system-on-chip device 822. However, each of the display 828, the input device 830, the speaker 836, the microphone 838, the antenna 842, and the power supply 844 can be coupled to a component of the system-on-chip device 822, such as an interface or a controller.

In conjunction with the described embodiments, an apparatus includes means for causing a first voltage difference between a gate of a semiconductor transistor structure and an overlap region of the semiconductor transistor structure to exceed a breakdown voltage of the semiconductor transistor structure. For example, the means for causing the first voltage difference to exceed the breakdown voltage may include the first word line 130 of FIG. 1, the first word line 230 of FIGS. 2-3, the first word line 430 of FIGS. 4-5, the access transistor 204 of FIG. 2, the bit line 236 of FIG. 2, the second word line 232 of FIG. 2, the well line 234 of FIG. 2, the access transistor 404 of FIG. 4, the hit line 436 of FIG. 4, the second word line 432 of FIG. 4, the well line 434 of FIG. 4, the processor 810 programmed to execute the instructions 856 of FIG. 8, one or more other devices, circuits, modules, or instructions to causing the first voltage difference to exceed the breakdown voltage, or any combination thereof.

The apparatus may also include means for maintaining a second voltage difference between the gate and a channel region of the semiconductor transistor structure at less than the breakdown voltage. For example, the means for maintaining the second voltage difference at less than the breakdown voltage may include the first word line 130 of FIG. 1, the first word line 230 of FIGS. 2-3, the well line 234 of FIG. 2, the first word line 430 of FIGS. 4-5, the well line 434 of FIG. 4, the processor 810 programmed to execute the instructions 856 of FIG. 8, one or more other devices, circuits, modules, or instructions to maintain the second voltage difference at less than the breakdown voltage, or any combination thereof.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 9 depicts a particular illustrative embodiment of an electronic device manufacturing process 900.

Physical device information 902 is received at the manufacturing process 900, such as at a research computer 906. The physical device information 902 may include design information representing at least one physical property of a semiconductor device, such as a device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof. For example, the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of semiconductor devices including the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, or any combination thereof, of the library file 912. For example, a user of the design computer 914 may enter circuit design information 922 via a user interface 924 coupled to the design computer 914.

The circuit design information 922 may include design information representing at least one physical property of a semiconductor device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing a device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, and that also includes additional electronic circuits and components within the SOC.

The GDSII file 926 may be received at a fabrication process 928 to manufacture a semiconductor device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 934, which may be tested and separated into dies, such as a representative die 936. The die 936 includes a circuit including the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including the a device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3 the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof. In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a set top box, a music player, a video player, an entertainment unit, a navigation device, a communications device, a personal digital assistant (PDA), a fixed location data unit, and a computer, into which the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof is integrated. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, embodiments of the disclosure may be suitably employed in any device which includes active integrated circuitry including memory and on-chip circuitry.

A device that includes the semiconductor transistor structure 100 of FIG. 1, the components of the semiconductor transistor structure 100 of FIG. 1, the circuit 200 of FIG. 2, the components of the circuit 200 of FIG. 2, the semiconductor transistor structure 202 of FIG. 3, the components of the semiconductor transistor structure 202 of FIG. 3, the circuit 400 of FIG. 4, the components of the circuit 400 of FIG. 4, the semiconductor transistor structure 402 of FIG. 5, the components of the semiconductor transistor structure 402 of FIG. 5, or any combination thereof, may be fabricated, processed, and incorporated into an electronic device, as described in the illustrative process 900. One or more aspects of the embodiments disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages of production from a physical device design to a final product are depicted, in other embodiments fewer stages may be used or additional stages may be included. Similarly, the process 900 may be performed by a single entity or by one or more entities performing various stages of the process 900.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
creating a breakdown condition at a semiconductor transistor structure that includes an overlap region and a channel region by causing a first voltage difference between a gate and the overlap region to exceed a breakdown voltage of the semiconductor transistor structure while maintaining a second voltage difference between the gate and the channel region at less than the breakdown voltage,
wherein the breakdown condition is based on a programming operation at the semiconductor transistor structure, and wherein the programming operation includes applying a first voltage to the gate and applying a second voltage to the overlap region.

2. The method of claim 1, wherein the semiconductor transistor structure includes an n-type metal oxide semiconductor (NMOS) transistor, and wherein the overlap region is a drain overlap region.

3. The method of claim 2, wherein the first voltage comprises a gate voltage, and wherein the second voltage comprises a program voltage.

4. The method of claim 2, wherein the second voltage is greater than the first voltage.

5. The method of claim 2, wherein maintaining the second voltage difference includes applying a well voltage to a body of the NMOS transistor, wherein the channel region is formed within the body, and wherein the first voltage is approximately equal to the well voltage.

6. The method of claim 5, wherein the first voltage is approximately ground.

7. The method of claim 5, further comprising performing a reading operation at the NMOS transistor after the breakdown condition is created, wherein performing the reading operation includes applying a read voltage to the drain overlap region or applying the read voltage to the gate.

8. The method of claim 7, wherein the read voltage is smaller than a supply voltage.

9. The method of claim 1, wherein the semiconductor transistor structure includes a p-type metal oxide semiconductor (PMOS) transistor, and wherein the overlap region is a drain overlap region.

10. The method of claim 9, wherein the first voltage comprises a program voltage, and wherein the second voltage comprises a drain voltage.

11. The method of claim 9, wherein the second voltage is less than the first voltage.

12. The method of claim 9, wherein maintaining the second voltage difference includes applying a well voltage to a body of the PMOS transistor, wherein the channel region is formed within the body, and wherein a first difference between the first voltage and the well voltage is less than a second difference between the first voltage and the second voltage.

13. The method of claim 9, further comprising performing a reading operation at the PMOS transistor after the breakdown condition is created, wherein performing the reading operation includes applying a read voltage to the gate or applying the read voltage to the drain overlap region.

14. The method of claim 13, wherein the read voltage is less than a supply voltage.

15. The method of claim 1, wherein creating the breakdown condition is initiated at a processor integrated into an electronic device.

16. An apparatus comprising:
a p-type one-time-programmable (OTP) device, wherein the p-type OTP device includes:
an access transistor; and
a semiconductor transistor structure that includes a drain overlap region and a channel region, the channel region having an n-type doping characteristic, wherein the drain overlap region is coupled to the access transistor, wherein a breakdown condition of the semiconductor transistor structure is indicative of a stored data value, wherein the semiconductor transistor structure further comprises a gate coupled to receive a first voltage, and wherein the drain overlap region is coupled to receive a second voltage.

17. The apparatus of claim 16, wherein a well of the access transistor is coupled to a well of the semiconductor transistor structure.

18. The apparatus of claim 16, wherein the first voltage comprises a programming voltage.

19. The apparatus of claim 16, wherein the gate includes a p-type doping characteristic, a p-type metal, or an n-type metal.

20. The apparatus of claim 16, wherein the p-type OTP device is integrated into at least one semiconductor die.

21. The apparatus of claim 16, further comprising a device selected from the group consisting of a set top box, a music player, a video player, an entertainment unit, a navigation device, a communications device, a personal digital assistant (PDA), a fixed location data unit, and a computer, into which the p-type OTP device is integrated.

22. An apparatus comprising:
means for causing a first voltage difference between a gate of a semiconductor transistor structure and an overlap region of the semiconductor transistor structure to exceed a breakdown voltage of the semiconductor transistor structure, wherein the means for causing the first voltage difference creates a breakdown condition at the semiconductor transistor structure between the gate and the overlap region, wherein the breakdown condition is based on a programming operation at the semiconductor transistor structure, and wherein the programming operation includes applying a first voltage to the gate and applying a second voltage to the overlap region; and
means for maintaining a second voltage difference between the gate and a channel region of the semiconductor transistor structure at less than the breakdown voltage.

23. The apparatus of claim 22, further comprising means for performing a reading operation at the semiconductor transistor structure after the breakdown condition is created.

24. The apparatus of claim 22, wherein the semiconductor transistor structure include an n-type metal oxide semiconductor (NMOS) transistor, and wherein the overlap region is a drain overlap region.

25. The apparatus of claim 22, wherein the semiconductor transistor structure includes a p-type metal oxide semiconductor (PMOS) transistor, and wherein the overlap region is a drain overlap region.

26. The apparatus of claim 22, further comprising a device selected from the group consisting of a set top box, a music player, a video player, an entertainment unit, a navigation device, a communications device, a personal digital assistant (PDA), a fixed location data unit, and a computer, into which the means for causing the first voltage difference and the means for maintaining the second voltage difference are integrated.

27. A method comprising:
receiving design information representing at least one physical property of a semiconductor device, the semiconductor device comprising:
a p-type one-time-programmable (OTP) device, wherein the p-type OTP device includes:
an access transistor; and
a semiconductor transistor structure that includes a drain overlap region and a channel region, the channel region having a n-type doping characteristic, wherein the drain overlap region is coupled to the access transistor, wherein a breakdown condition of the semiconductor transistor structure is indicative of a stored data value, wherein the semiconductor transistor structure further comprises a gate coupled to receive a first voltage, and wherein the drain overlap region is coupled to receive a second voltage;
transforming the design information to comply with a file format; and
generating a data file including the transformed design information.

28. The method of claim 27, wherein the data file comprises a GDSII format.

29. The method of claim 27, wherein the data file comprises a GERBER format.

30. An apparatus comprising:
an n-type one-time-programmable (OTP) device, wherein the n-type OTP device includes:
an access transistor; and
a semiconductor transistor structure that includes a drain overlap region and a channel region, the channel region having a p-type doping characteristic, wherein the drain overlap region is coupled to the access transistor, wherein a breakdown condition of the semiconductor transistor structure is indicative of a stored data value, wherein the semiconductor transistor structure further comprises a gate coupled to receive a first voltage, and wherein the drain overlap region is coupled to receive a second voltage.

31. The apparatus of claim 30, wherein the gate includes an n-type doping characteristic, a p-type metal, or an n-type metal.

32. The apparatus of claim 30, wherein the n-type OTP device is integrated into at least one semiconductor die.

33. The apparatus of claim 30, further comprising a device selected from the group consisting of a set top box, a music player, a video player, an entertainment unit, a navigation device, a communications device, a personal digital assistant (PDA), a fixed location data unit, and a computer, into which the n-type OTP device is integrated.

34. A non-transitory computer-readable medium comprising instructions that, when executed by a processor, cause the processor to initiate creation of a breakdown condition at a semiconductor transistor structure that includes an overlap region and a channel region by causing a first voltage difference between a gate and the overlap region to exceed a breakdown voltage of the semiconductor transistor structure while maintaining a second voltage difference between the gate and the channel region at less than the breakdown voltage, wherein the breakdown condition is based on a programming operation at the semiconductor transistor structure, and wherein the programming operation includes applying a first voltage to the gate and applying a second voltage to the overlap region.

35. The non-transitory computer-readable medium of claim 34, wherein the semiconductor transistor structure includes an n-type metal oxide semiconductor (NMOS) transistor, and wherein the overlap region is a drain overlap region.

36. The non-transitory computer-readable medium of claim 35, wherein the first voltage comprises a gate voltage, and wherein the second voltage comprises a program voltage.

37. The non-transitory computer-readable medium of claim 36, wherein the second voltage is greater than the first voltage.

38. The non-transitory computer-readable medium of claim 34, wherein the semiconductor transistor structure includes a p-type metal oxide semiconductor (PMOS) transistor, and wherein the overlap region is a drain overlap region.

39. The non-transitory computer-readable medium of claim 38, wherein the first voltage comprises a program voltage, and wherein the second voltage comprises a drain voltage.

40. The non-transitory computer-readable medium of claim 39, wherein the second voltage is less than the first voltage.

* * * * *